United States Patent
Papasouliotis et al.

(10) Patent No.: US 7,297,608 B1
(45) Date of Patent: *Nov. 20, 2007

(54) METHOD FOR CONTROLLING PROPERTIES OF CONFORMAL SILICA NANOLAMINATES FORMED BY RAPID VAPOR DEPOSITION

(75) Inventors: George D. Papasouliotis, Cupertino, CA (US); Raihan M. Tarafdar, San Jose, CA (US); Ron Rulkens, Milpitas, CA (US); Dennis M. Hausmann, Los Gatos, CA (US); Jeff Tobin, Mountain View, CA (US); Adrianne K. Tipton, Fremont, CA (US); Bunsen Nie, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 10/874,696

(22) Filed: Jun. 22, 2004

(51) Int. Cl.
H01L 21/76 (2006.01)
(52) U.S. Cl. ......... 438/404; 257/E21.54; 257/E21.564; 257/E21.545; 257/E21.565; 438/294
(58) Field of Classification Search ............... 438/778, 438/781, 789, 790, 907, 909, 935, 294; 257/E21.54, 257/E21.564, E21.545, E21.565
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,597,395 A | 1/1997 | Bocko et al. | |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,064,104 A | 5/2000 | Omid-Zohoor et al. | |

(Continued)

FOREIGN PATENT DOCUMENTS

JP 5-308071 A 11/1993

(Continued)

OTHER PUBLICATIONS

Dennis Michael Hausmann, "Atomic Layer Deposition of Metal Oxide Thin Films," A thesis presented by, Harvard University, 186 pages, Jul. 2002.

(Continued)

*Primary Examiner*—W. David Coleman
*Assistant Examiner*—Su C. Kim
(74) *Attorney, Agent, or Firm*—Beyer Weaver LLP

(57) ABSTRACT

A method employing atomic layer deposition rapid vapor deposition (RVD) conformally deposits a dielectric material on small features of a substrate surface. The resulting dielectric film is then annealed using a high density plasma (HDP) at a temperature under 500° C. in an oxidizing environment. The method includes the following three principal operations: exposing a substrate surface to an aluminum-containing precursor gas to form a substantially saturated layer of aluminum-containing precursor on the substrate surface; exposing the substrate surface to a silicon-containing precursor gas to form the dielectric film; and annealing the dielectric film in a low temperature oxygen-containing high density plasma. The resulting film has improved mechanical properties, including minimized seams, improved WERR, and low intrinsic stress, comparable to a high temperature annealing process (~800° C.), but without exceeding the thermal budget limitations of advanced devices.

32 Claims, 8 Drawing Sheets

U.S. PATENT DOCUMENTS

| | | | |
|---|---|---|---|
| 6,102,993 | A | 8/2000 | Bhandari et al. |
| 6,133,160 | A | 10/2000 | Komiyama et al. |
| 6,184,108 | B1 | 2/2001 | Omid-Zohoor et al. |
| 6,184,143 | B1 | 2/2001 | Ohashi et al. |
| 6,300,219 | B1 | 10/2001 | Doan et al. |
| 6,316,063 | B1 | 11/2001 | Andideh et al. |
| 6,335,261 | B1 | 1/2002 | Natzle et al. |
| 6,352,943 | B2 | 3/2002 | Maeda et al. |
| 6,352,953 | B1 | 3/2002 | Seki et al. |
| 6,372,669 | B2 | 4/2002 | Sandhu et al. |
| 6,503,330 | B1 | 1/2003 | Sneh et al. |
| 6,504,233 | B1 | 1/2003 | Gorczyca et al. |
| 6,511,399 | B2 | 1/2003 | Mc Collum Etchason et al. |
| 6,511,539 | B1 | 1/2003 | Raaijmakers |
| 6,531,377 | B2 | 3/2003 | Knorr et al. |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,586,349 | B1 | 7/2003 | Jeon et al. |
| 6,624,091 | B2 | 9/2003 | Yuan |
| 6,780,789 | B1 | 8/2004 | Yu et al. |
| 6,784,101 | B1 | 8/2004 | Yu et al. |
| 6,802,944 | B2 | 10/2004 | Ahmad et al. |
| 6,861,334 | B2 | 3/2005 | Raaijmakers et al. |
| 6,867,152 | B1 * | 3/2005 | Hausmann et al. ......... 438/778 |
| 6,903,005 | B1 | 6/2005 | Marsh |
| 6,908,862 | B2 | 6/2005 | Li et al. |
| 6,949,481 | B1 * | 9/2005 | Halliyal et al. ............. 438/795 |
| 6,984,591 | B1 | 1/2006 | Buchanan et al. |
| 7,097,878 | B1 | 8/2006 | Rulkens et al. |
| 7,129,189 | B1 | 10/2006 | Hausmann et al. |
| 7,148,155 | B1 | 12/2006 | Tarafdar et al. |
| 7,163,899 | B1 | 1/2007 | Cho et al. |
| 7,202,185 | B1 | 4/2007 | Hausmann et al. |
| 7,223,707 | B1 | 5/2007 | Papasouliotis et al. |
| 2001/0049205 | A1 | 12/2001 | Sandhu et al. |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0134741 | A1 * | 7/2003 | Weisbeck et al. ........... 502/243 |
| 2003/0157781 | A1 | 8/2003 | Macneil et al. |
| 2004/0004247 | A1 | 1/2004 | Forbes et al. |
| 2004/0025787 | A1 | 2/2004 | Selbrede et al. |
| 2004/0043149 | A1 | 3/2004 | Gordon et al. |
| 2004/0043569 | A1 | 3/2004 | Ahn et al. |
| 2004/0044127 | A1 | 3/2004 | Okubo et al. |
| 2004/0079728 | A1 | 4/2004 | Mungekar et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2004/0222490 | A1 | 11/2004 | Raaijmakers et al. |
| 2004/0247787 | A1 | 12/2004 | Mackie et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2005/0271813 | A1 | 12/2005 | Kher et al. |
| 2006/0038293 | A1 | 2/2006 | Rueger et al. |
| 2006/0087000 | A1 | 4/2006 | Okuno |
| 2006/0127578 | A1 | 6/2006 | Li et al. |

FOREIGN PATENT DOCUMENTS

| | | |
|---|---|---|
| JP | 2004-256479 | 9/2004 |
| WO | WO02/27063 | 4/2002 |
| WO | WO03/083167 A1 | 10/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor.Deposition 2003, 9, No. 2, pp. 73-78.

Roland et al., "Theoretical Modeling of $SiO_2$ Photochemical Vapor Deposition and Comparison to Experimental Results for Three Oxidant Chemistries: $SiH_4 + O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour depostion conditons", J. Chem. Soc., Dalton Trans., 2000, 2673-2677.

Gaillard et al., "Effect of plasma and thermal annealing on chemical vapor deposition dielectrics grown using $SIH_4$—$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infared Characterization of Downstream Gas-Phase Species Generated by Tetraethylorthosilicate/ Ozone Atomospheric Pressure Reactions", Journal of The Eletrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec,. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., Appln. No. Not yet assigned, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 7, 2005, from U.S. Appl. No. 10/874,808.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. 11/327,668, filed Jan. 5, 2006, pp. 1-28.

Papasouliotis et al., "Reactive Seam Healing Methods for Improving Film Integrity in Structures of Confined Geometry", Novellus Systems, Inc., U.S. Appl. 11/334,762, filed Jan. 17, 2006, pp. 1-24.

U.S. Office Action mailed Dec. 5, 2005, from U.S. Appl. No. 10/746,274.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed Jul. 7, 2006, from U.S. Appl. No. 10/875,158.

U.S. Office Action mailed Sep. 27, 2006, from U.S. Appl. No. 11/021,558.

U.S. Office Action mailed Sep. 27, 2006, from U.S. Appl. No. 11/026,284.

U.S. Office Action mailed Sep. 29, 2006, from U.S. Appl. No. 11/027,480.

U.S. Office Action mailed Mar. 21, 2007, from U.S. Appl. No. 11/414,459.

U.S. Office Action mailed Apr. 13, 2007, from U.S. Appl. No. 11/026,284.

U.S. Office Action mailed Mar. 23, 2007, from U.S. Appl. No. 11/021,558.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Apr. 25, 2006, from U.S. App. No. 11/021,558.

U.S. Office Action mailed May 8, 2006, from U.S. Appl. No. 11/327,668.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition(RVD) Using a Nucleation Layer", Novellus Systems, Inc., filed Jun. 22, 2004, U.S. Appl. No. 10/875,158, pp. 1-25.

U.S. Office action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Gaillard et al. "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 μm Interconnects", pp. 1-3, no date supplied.

Hockele et al., "Flowfill-Process as a New Concept for Inter-Metal-Dielectrics", Siemens AG, Semiconductor Group, 1998, pp. 235-238.

\* cited by examiner

METHOD FOR CONTROLLING PROPERTIES OF CONFORMAL SILICA NANOLAMINATES FORMED BY RAPID VAPOR DEPOSITION

BACKGROUND OF THE INVENTION

It is often necessary in semiconductor processing to fill a high aspect ratio gap with insulating material. One example of a high aspect ratio trench encountered in semi-conductor processing is in the formation of shallow trench isolation (STI). As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where HDP processes are challenged in filling the high aspect ratio structures (AR>7:1) using existing technology (see, for example, U.S. Pat. No. 6,030,881). For structures representative of the 65 nm and 45 nm technology nodes, engineering the gap-fill process becomes structure dependent, hence the process needs to be reoptimized, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods. The process is described in the paper by Hausmann et. al. entitled Rapid Vapor Deposition of Highly Conformal Silica Nanolaminates (2002, Science, 298, pages 403-406).

The polymeric film deposited by the above process requires densification in order for its properties to match those of silicon oxide (USG), which will allow of its succesful integration into functioning devices. Moreover, the conformal nature of the process results in the formation of seams in filled trenches, which may allow attack by post gap fill wet etch (HF-based) in the seam. Etching in the seam can allow for polysilicon deposition in the seam during subsequent processing which would obviate its insulating effect. Therefore, a process sequence to anneal the film and substantially eliminate seams and voids is required.

Optimally, this process sequence can operate at under 500° C., in order to be able to meet the thermal budget requirements of advanced devices (see A. R. Londergan, et. al., J. Electrochem. Soc., vol. 148, pp. C21-C27, January 2001). In pre-metal dielectric (PMD) applications, for example, where a layer of silica is applied over gates that have been previously built-up on a substrate, there is an inherent temperature limitation due to the material used to construct the gates (usually a metal silicide such as a nickel silicide.) At temperatures above about 400-500° C., the gate silicide may become discontinuous, thereby increasing the resistance of the circuit and leading to performance problems. Further, there may be two or three PMD layers applied to a substrate before application of metal conductors. Thus, it is desirable to implement a method to improve the material properties of the dielectric film while maintaining temperatures that are low enough to avoid damaging underlying structures.

SUMMARY OF THE INVENTION

The present invention provides a method for using a low temperature (i.e., below 500° C.) HDP (high density plasma)-based anneal process to improve the mechanical properties of a dielectric film. This method is applicable to semiconductor gap-fill applications, such as inter-metal dielectric (IMD) layers, premetal dielectric (PMD) and shallow trench isolation (STI).

The invention provides a method for using RVD techniques to produce a highly conformal dielectric film onto a substrate, followed by an HDP anneal step in an oxidizing environment which improves the properties of the film while maintaining a sufficiently low temperature such that damage to underlying structures is avoided.

This method involves three principle operations: 1) exposing a substrate surface to a catalytic metal-containing precursor gas to form a substantially saturated layer of catalytic metal-containing precursor on the substrate surface, 2) exposing the substrate surface to a silicon-containing precursor gas to form a dielectric layer on the substrate surface, and 3) annealing the film at temperatures below 500° C. using HDP under oxidizing conditions.

Various process precursors may be used in preferred embodiments of the invention. For example, the catalytic metal-containing precursor can be an aluminum-containing precursor, such as hexakis(dimethylamino) aluminum or trimethyl aluminum. Flow rates of aluminum-containing precursor gas can range broadly, e.g., between about 1 and 10000 sccm. Preferred flow rates of aluminum-containing precursor gas range between about 100 and 400 sccm.

The silicon containing precursor can be a silanol, such as tris(tert-butoxy)silanol (($C_4H_9O$)$_3$SiOH) or tris(tert-pentoxy)silanol (($C_5H_{11}O$)$_3$SiOH), or a silanediol, such as di(tert-butoxy)silandiol. Preferred flow rates for the silicon-containing precursor range between about 200 to 1000 sccm.

The resulting dielectric film has improved properties after annealing. In one embodiment, the silicon-containing dielectric film has a k-value less than about 4.1; a film stress of less than 2 Gdyn/cm$^2$; and a wet etch rate ratio (WERR) of less than 2:1 relative to thermal oxide. For example, the dielectric film has a k-value of between about 3.8-4.0 and a film stress of between about 2 Gdyn/cm$^2$ tensile and 2 Gdyn/cm$^2$ compressive.

In preferred embodiments of the invention, the substrate is a partially fabricated semiconductor wafer. Further, the wafer may include premetal dielectric (PMD) and/or shallow trench isolation (STI) features, over which the dielectric film is to be deposited.

Exposure to the aluminum-containing precursor and the silicon-containing precursor may occur in the same chamber or different chambers in preferred embodiments of the invention. Further, additional precursor gases may be used.

DETAILED DESCRIPTION

Figure 1:
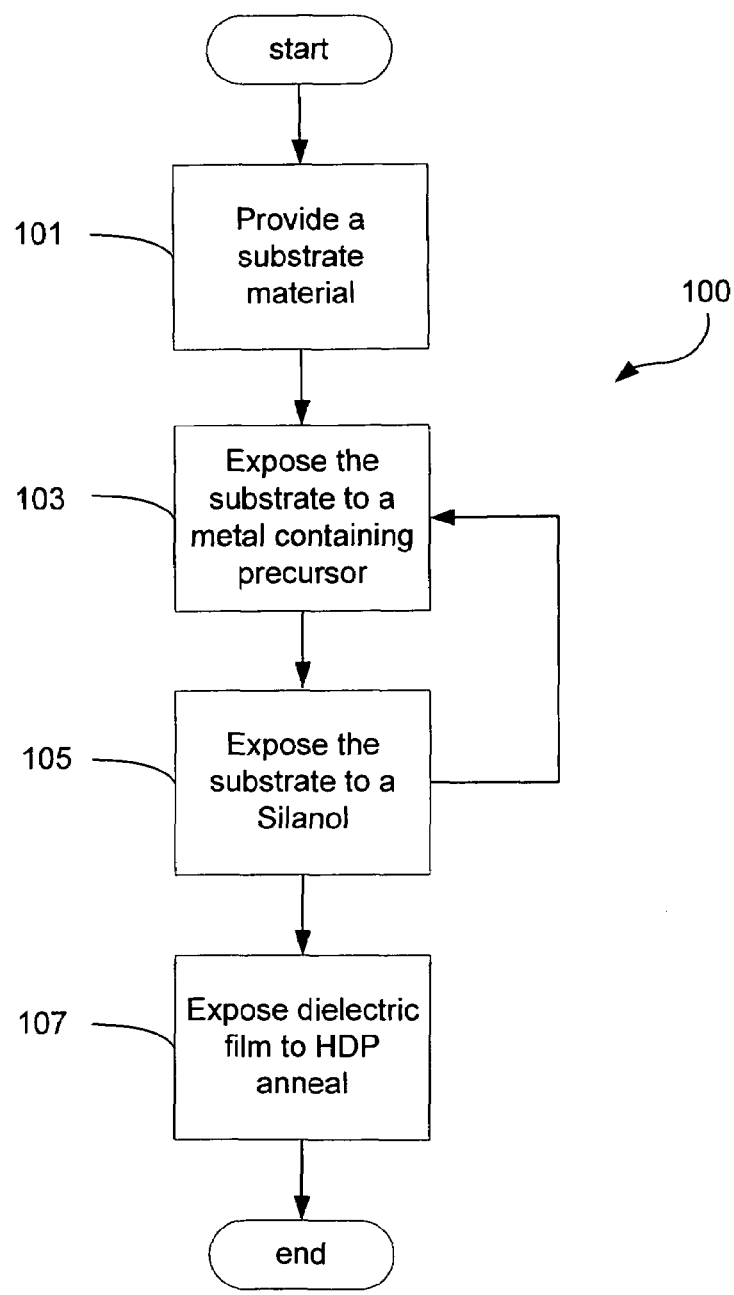
FIG. 1 is a process flow diagram illustrating relevant operations employing rapid vapor deposition (RVD) plus HDP anneal to form a dielectric film with desirable properties in accordance with the present invention.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, the present invention provides a method for using an HDP anneal process to improve the mechanical properties of a dielectric film deposited using RVD. This method can be used to densify the nanolaminate RVD film post deposition and prevent the occurrence of seams in the material deposited in trenches and improve gap-fill performance. It pertains to IMD, STI and PMD applications.

Generally, a RVD method involves sequentially depositing a plurality of atomic-scale films on a substrate surface by sequentially exposing and removing reactants to and from the substrate surface. An exemplary case of RVD using reactant gases A and B will now be used to illustrate principle operations of a RVD process in accordance with the present invention. First, gas A is injected into a chamber and the molecules of gas A are chemically or physically adsorbed to the surface of a substrate, thereby forming a "saturated layer" of A. Formation of a saturated layer is self-limiting in nature and represents a thermodynamically distinct state of adsorbed A on a surface. In some cases, a saturated layer is only one monolayer. In other cases, a saturated layer is a fraction of a monolayer, or some multiple of monolayers.

After a saturated layer of A is formed, typically, the remaining gas A in the chamber is purged using an inert gas. Thereafter, the gas B is injected so that it comes in contact with the adsorbed layer of A and reacts to form a reaction product of A and B. Because the saturated layer of A is nominally thin and evenly distributed over the substrate surface, excellent film step coverage can be obtained. B is flowed over the substrate for a period of time sufficient to allow the reaction between A and B to preferably go to completion; i.e., all of the adsorbed A is consumed in the reaction. In a RVD process, B is flowed over the substrate for a period of time sufficient for B to accumulate to thicknesses in excess of one monolayer. After a desired film thickness is achieved, the flow of B is stopped and the reaction is halted. At this point, residual gas B and any byproducts of the reaction are purged from the chamber. Further RVD cycles of substrate exposure to A, followed by exposure to B, can be implemented and repeated as needed for multiple layers of material to be deposited.

RVD methods are related to the well-established chemical vapor deposition (CVD) techniques. However, in CVD, the chemical reactant gases are simultaneously introduced in a reaction chamber and allowed to mix and chemically react with each other in gas phase. The products of the mixed gases are then deposited on the substrate surface. Thus, RVD methods differ from CVD since in RVD the chemical reactant gases are individually injected into a reaction chamber and not allowed to mix prior to contacting the substrate surface. That is, RVD is based on separated surface-controlled reactions.

FIG. 1 is a process flow diagram illustrating relevant operations in a rapid vapor deposition (RVD) and high-density plasma (HDP) anneal process to form a dielectric film in accordance with the present invention.

The deposition process 100 begins with operation 101, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, two commercially important applications of the present invention are premetal dielectric (PMD) and shallow trench isolation (STI).

Next, in operations 103-105, an RVD process is used to deposit a dielectric layer on the substrate. For an example of a suitable RVD process, see U.S. patent application Ser. Nos. 10/672,309, titled "Properties Of A Silica Thin Film Produced By A Rapid Vapor Deposition [RVD] Process", filed on Sep. 26, 2003, which is hereby incorporated by reference herein for all purposes. In operation 103, illustrated in reaction stage (a) above, a metal catalyst-containing precursor gas is pumped into the deposition chamber so as to substantially saturate the surface with the metal-catalyst containing precursor.

Any suitable metal catalyst-containing precursor that can sufficiently adsorb onto the substrate surface and sufficiently react with the subsequently added silicon-containing precursor to form a dielectric layer that is more than a monolayer thick may be used. In addition, the metal-containing precursor should be capable of aiding the catalytic polymerization of the subsequently added silicon-containing precursor to produce a film thicker than a monolayer. In preferred embodiments, an aluminum-containing precursor, for example, hexakis(dimethylamino)aluminum $(Al_2(N(CH_3)_2)_6)$ or trimethylaluminum $(Al(CH_3)_3)$ is used. Other suitable aluminum-containing precursors include, for example, triethylaluminum $(Al(CH_2CH_3)_3)$ or aluminum trichloride $(AlCl_3)$. Other metal-containing precursors that can be deposited to reactivate the catalytic surface include, but are not limited to, zirconium, hafnium, gallium, titanium, niobium, tantalum, and their oxides or nitrides.

As indicated earlier, forming a saturated layer is a self-limiting process and to a certain extent independent of process conditions. Relevant process conditions can include pressure, precursor flow rate, substrate temperature, and dose. Pressures can range broadly, e.g., between about 1 mTorr and 760 Torr. Typical pressures range between about 100 and 750 mTorr and typical temperatures range between about 250 and 300 degrees Celsius. Flow rates of aluminum-containing precursor gas can range broadly, e.g., between about 1 and 10000 sccm. Preferred flow rates of aluminum-containing precursor gas range between about 100 and 400 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 1 to 2 seconds is found to be sufficient.

Next, after the chamber is purged, process 100 continues with the exposure of the substrate to a silicon-containing precursor gas under conditions suitable for the growth of a dielectric film in operation 105. Any suitable silicon-containing precursor that can sufficiently adsorb onto and react with the saturated layer of aluminum-containing precursor to form a dielectric film may be used. In addition, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy) silanol $((C_4H_9O)_3SiOH)$, tris(tert-pentoxy)silanol $((C_5H_{11}O)_3SiOH)$, di(tert-butoxy)silandiol $((C_4H_9O)_2Si(OH)_2)$ and methyl di(tert-pentoxy)silanol.

Operations 103-105 are repeated as necessary until a desired thickness of dielectric material has been reached.

While the invention is not limited to this theory of operation, as mentioned previously, it is believed that the accumulation of dielectric film is achieved via a polymerization process. The saturated layer of aluminum precursor can catalytically polymerize the silicon-containing precursor to produce growing chains of silica. After a period of growth determined by the substrate temperature, the silica polymer can "gel" or "cross-link" to form a solid silicon dioxide. The final film thickness depends on the silicon dioxide layer formation rate and the amount of time the silicon containing precursor is exposed to the saturated layer of aluminum atoms. The film can also be made thicker by repeating the number of precursor deposition cycles. Studies regarding these finding can be found in the doctoral thesis of Dennis Hausmann, Harvard University, (2002).

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. Temperatures can range from about 200 to 300° C. A typical deposition temperature is about 250° C. Pressures can range broadly, e.g., between about 1 mTorr and 760 Torr. Typical pressures range between about 100 and 750 mTorr. Flow rates of silicon-containing precursor gas can range broadly, e.g., between about 1 and 10000 sccm. Preferred flow rates of silicon-containing precursor gas range between about 200 and 1000 sccm. The dose of silicon-containing precursor can range broadly, e.g., between about 0.001 milligrams and 100 grams. Typical silicon-containing precursor doses range between about 0.1 and 0.3 grams. Exposure times can range broadly, e.g., between about 1 milliseconds and 100 seconds. Preferred exposure times typically range between about 1 and 10 seconds. The number of separate exposures to silicon-containing precursor will primarily depend upon the desired final film thickness.

Returning to FIG. 1, after a dielectric layer has been formed, an anneal operation 107 using a low temperature oxygen-containing inductively coupled high density plasma (HDP) is performed in order to improve the mechanical properties of the film. The HDP anneal is used to remove water from the as-deposited film. In the present invention, HDP operation 107 is performed in an oxidizing environment. Specifically, the oxidizer used is an oxygen-containing oxidizer such as $O_2$, $H_2O$, $H_2O_2$, air, or $O_3$. One advantage of using an oxygen-containing oxidizer is that the oxygen in the plasma reacts with the RVD deposited film to cross-link the silica and reduce or eliminate seams created during RVD gap fills. At the same time, the oxygen substitutes for the water that is removed from the film in the anneal process so that the film does not shrink and the film stress is not increased by water removal. Note that it is important to eliminate the seam in gap fill (STI, for example) by annealing to prevent attack by post gap fill wet etch (HF-based) in the seam. Etching in the seam can allow for polysilicon deposition in the seam in subsequent processing which would obviate its insulating effect.

Suitable temperatures range from about 250° C. to 750° C.; suitable pressures range from about 1 to 1000 mTorr; and suitable time ranges from about 30 sec to 20 min. In one embodiment of the invention, the annealing operation lasts from between about 330 to 700 seconds. In a second embodiment, the annealing operation lasts about 600 seconds.

The resulting dielectric film will have improved mechanical properties, such as an improved WERR (<2:1), relative to thermal oxide, dielectric constant equal to or less than that of thermal oxide, and low internal stress. In a first embodiment, the k-value is less than about 4.1. In other embodiments, film stress is between about 2 $Gdyn/cm^2$ compressive and 2 $Gdyn/cm^2$ tensile and k is between about 3.8 and 4.0. In a preferred embodiment, film shrinkage after annealing is less than about 4%.

Figure 2A:
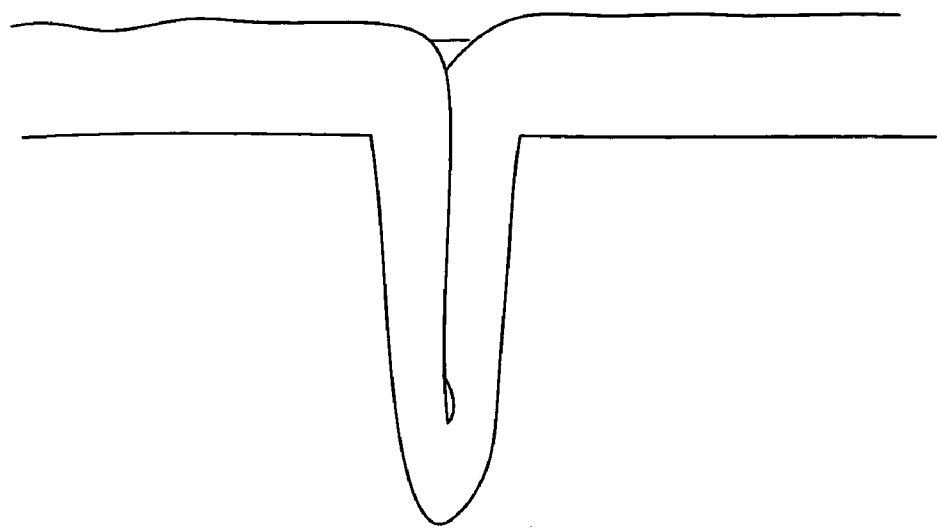
FIGS. 2A and B illustrate a gap fill process in accordance with the present invention.
Figure 2B:
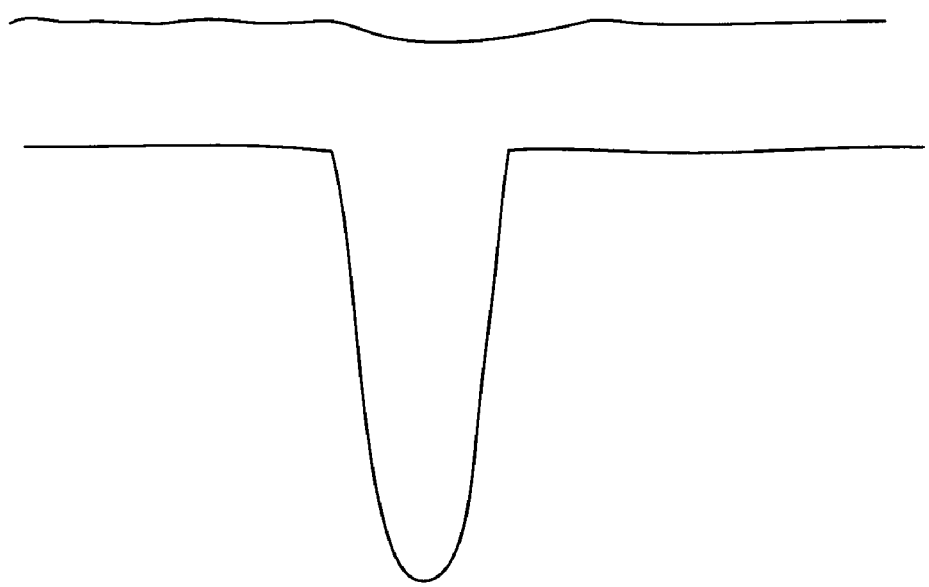

FIGS. 2A and B are drawings of gap fill showing a seam created during an RVD process (2A) and the knitted seam after HDP annealing. Note that the seam is substantially eliminated by the process.

OTHER EMBODIMENTS

This method applies to the gap-fill deposition of silica nanolaminates using RVD. However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (i.e. more than one kind of alkoxy substituent) may be used to improve the film characteristics. For an example, see U.S. patent application Ser. No. 10/874,814, titled "Mixed Alkoxy Precursors and Methods of Their Use for Rapid Vapor Deposition of $SiO_2$ Films". Furthermore, the properties of the dielectric film may be improved by other means as well, including by using an aluminum oxide nucleation layer formed by ALD prior to the application of the silica layer. See, for example, U.S. patent application Ser. No. 10/875,158, titled "Silica Thin Films Produced By Rapid Surface Catalyzed Vapor Deposition (RVD) Using a Nucleation Layer". Note also that this technique may be used in combination with a phosphorous getterer as described in U.S. patent application Ser. No. 10/874,808, titled "Aluminum Phosphate Incorporation In Silica Thin Films Produced By Rapid Surface Catalyzed Vapor Deposition (RVD) The above-referenced applications, which are concurrently filed with the present application, are incorporated by reference in their entirety for all purposes.

RVD Apparatus

Figure 3:
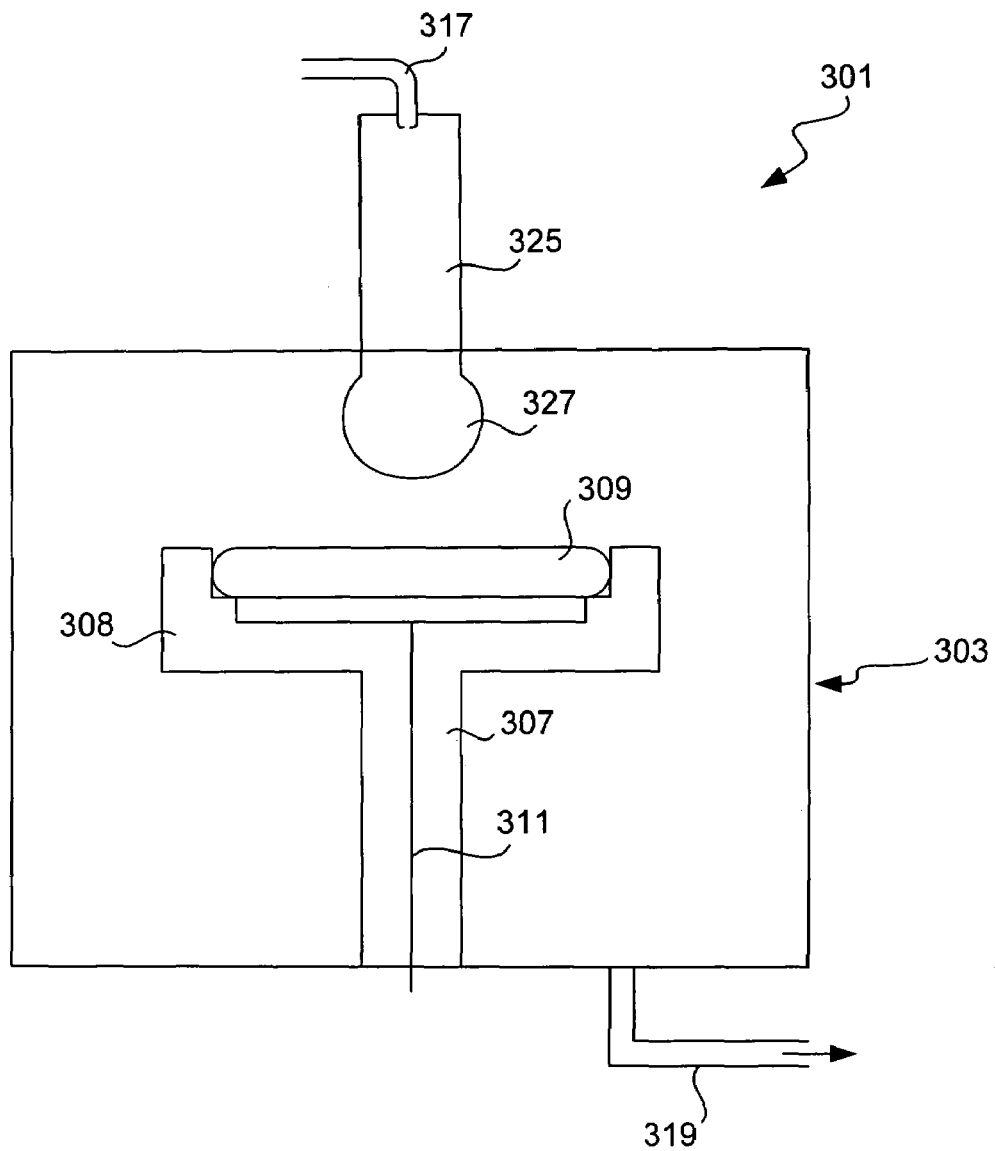
FIG. 3 is a schematic diagram showing the basic features of a RVD reactor module suitable for practicing the current invention.

FIG. 3 is a block diagram depicting some components of a suitable dual source RF/microwave plasma reactor for performing a RVD process in accordance with this invention. Note that this apparatus is only an example of suitable apparatus for RVD processes in accordance with the present invention. Many other apparatuses and systems, including a multi-chambered apparatus, may be used.

As shown, a reactor 301 includes a process chamber 303, which encloses components of the reactor and serves to contain the reactant gases and provide and area to introduce the reactant gases to substrate 309. The chamber walls may be made of or plated with any suitable material, generally a metal that is compatible with the deposition and associated processes conducted therein. In one example, the process chamber walls are made from aluminum. Within the process chamber, a wafer pedestal 307 supports a substrate 309. The pedestal 307 typically includes a chuck 308 to hold the substrate in place during the deposition reaction. The chuck 308 may be an electrostatic chuck, a mechanical chuck or various other types of chuck as are available for use in the industry and/or research.

A heat transfer subsystem including lines 311 for supplying a heat transfer fluid to the pedestal 307 controls the temperature of pedestal 307. In some embodiments, the heat transfer fluid comprises water or another liquid. The reactant gases, as well as inert gases during purge, are introduced individually into the reactor at tube 325 via inlet 317. A showerhead 327 may be used to distribute the gas flow uniformly in the process reactor. Reactant gases are introduced through a gas supply inlet mechanism including orifices. There may be multiple reactant gas tubes and inlets. A vacuum pump (e.g., a turbomolecular pump) connected to outlet 319 can draw out gases between RVD cycles.

Although various details of the apparatus have been omitted for clarity's sake, various design alternatives may be implemented.

HDP Apparatus

Various plasma reactor designs are suitable for use with this invention. The particular design is not critical to this invention. It merely needs to support an inductively coupled high-density plasma generated by the appropriate gases over the appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes to generate a plasma and a bias source for the substrate.

Figure 4:
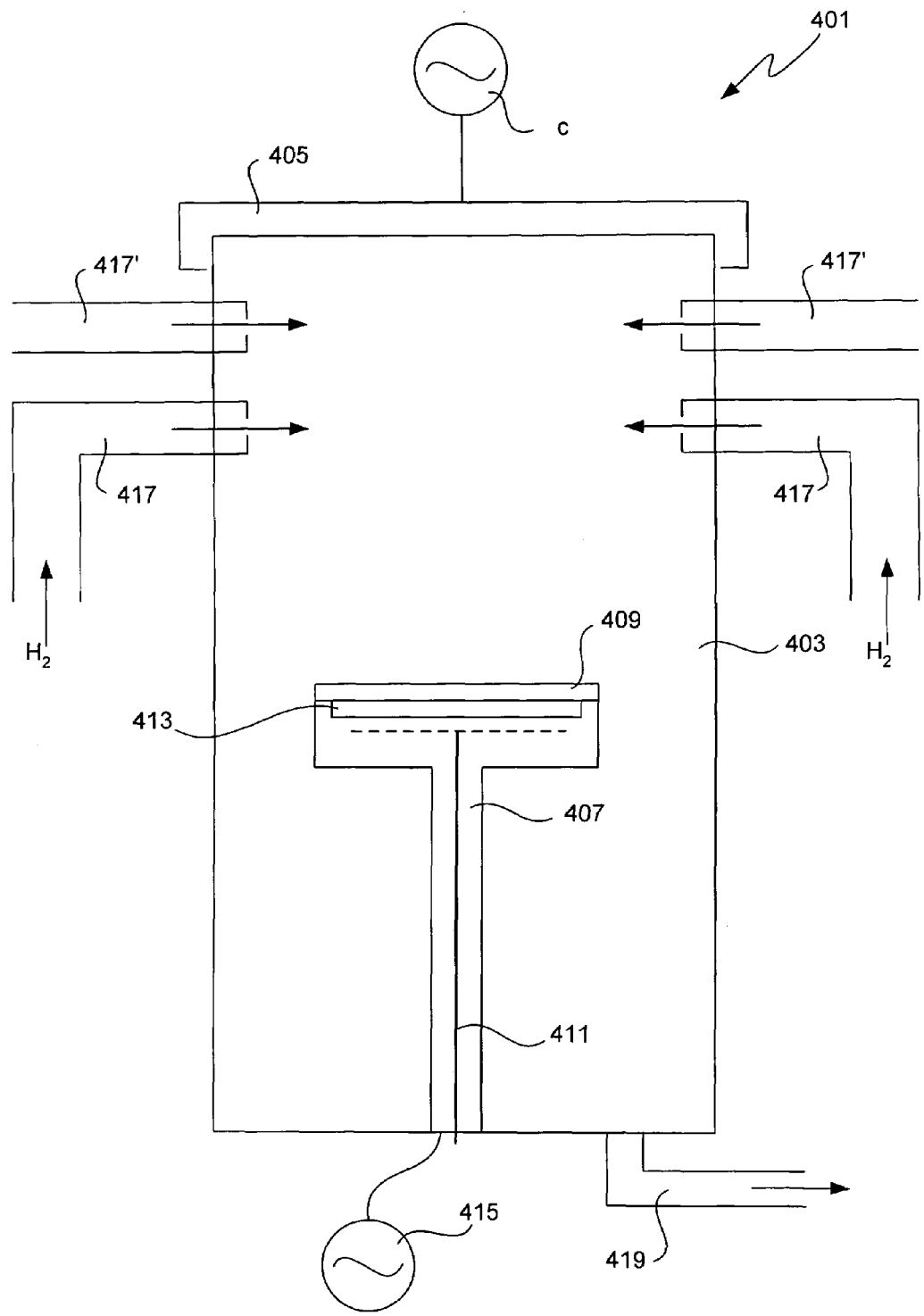
FIG. 4 is a schematic diagram showing the basic features of a HDP reactor module suitable for practicing the current invention.

FIG. 4 provides a simple block diagram depicting various reactor components arranged as in a conventional reactor. As shown, a reactor 401 includes a process chamber 403 which encloses other components of the reactor and serves to contain the plasma generated by an electrode 405. In one example, the process chamber walls are made from aluminum, aluminum oxide, and/or other suitable material. Electrode 405 is powered by a "low frequency" RF source 406. The power and frequency supplied by source 406 is sufficient to generate high-density plasma from the process gas.

Within the reactor, a wafer pedestal 407 supports a substrate 409. The pedestal typically includes a chuck to hold the substrate in place during the deposition reaction. The chuck may be an electrostatic chuck, a mechanical chuck or various other types of chuck as are available for use in the industry and/or research.

A heat transfer subsystem including a line 411 for supplying a heat transfer fluid controls the temperature of substrate 409. In some embodiments, the heat transfer fluid comprises at least one of helium and argon gas. The heat transfer fluid is supplied to a space 413 between the surface of the substrate and a surface of the chuck.

A "high frequency" RF source 415 serves to electrically bias substrate 409 and draw charged precursor species onto the substrate for the deposition reaction. Electrical energy from source 415 is coupled to substrate 409 via an electrode or capacitive coupling, for example. Note that the bias applied to the substrate need not be an RF bias. Other frequencies and DC bias may be used as well. In a specific embodiment, source 415 supplies a radio frequency bias to the substrate, and the radio frequency bias is generated by supplying the electrode with about 500 W of power.

The process gases, in this case the oxidant(s), are introduced via one or more inlets 417 and 417'. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gases or gas mixtures may be introduced from a primary gas ring, which may or may not direct the gases toward the substrate surface. Injectors may be connected to the primary gas ring to direct at least some of the gases or gas mixtures into the chamber and toward substrate. Note that injectors, gas rings or other mechanisms for directing process gas toward the wafer are not critical to this invention. The sonic front caused by a process gas entering the chamber will itself cause the gas to rapidly disperse in all directions—including toward the substrate. Process gases exit chamber 403 via an outlet 419. A vacuum pump (e.g., a turbomolecular pump) typically draws process gases out and maintains a suitably low pressure within the reactor.

Reactor pressure is held at a value necessary to sustain the high-density plasma. Preferably the process vessel is maintained at a pressure of at most about 200 mTorr. In some cases, the process chamber pressure is maintained below 1 mTorr. For many applications, however, the pressure is maintained between about 1 and 1000 mTorr; most preferably between about 1 and 30 mTorr. In one embodiment of the invention, the pressure is maintained at about 2 mTorr during annealing.

Wafer temperature should be maintained sufficiently high to ensure that complete film densification. However, the temperature may be limited by process constraints, such as thermal budget limitations that preclude temperatures above 500° C. Such constraints become increasingly common with advanced technologies and corresponding smaller feature sizes. For such applications, the anneal temperature is preferably maintained between about 300 and 500° C. The low frequency power applied to the upper electrode (for generating the plasma) typically varies from 1 kW to 20 kW, and the high frequency power (for biasing the wafer) typically reaches at least about 0.1 W/cm$^2$, for example 1W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

EXAMPLES

The following prospective example provides details concerning the implementation of an embodiment of the present invention. It should be understood the following is representative only, and that the invention is not limited by the detail set forth in this example.

The HDP anneal is carried out in a high density plasma reactor. The main effects of an HDP plasma on the properties of the film post anneal are summarized by the various experimental examples below.

An HDP anneal process using O$_2$ has a reactive component. This is shown in experimental examples 1 and 2 below, where an O$_2$ HDP annealing process is compared with an Argon HDP annealing process, with all other process values kept constant. These examples show that for a given time/power/gas flow rate, the final stress and film shrinkage are much better for the reactive O$_2$, where the film shrinkage is about 3.06%, than for the inert Argon, where the film shrinkage is about 12.15%. In both examples, the precursors used were trimethyl aluminum and silanol. The pressure was maintained at 2 mTorr for the depositions. All other process conditions are shown below.

Example 1

O$_2$ Gas HDP Anneal

Time: 700 s
LF Power: 5750 W
Gas flow rate: 250 sccm
Avg. Temperature: 469° C.
Stress, Post Anneal: 0.537 dyn/cm$^2$
k, Post Anneal: 3.87
WERR, Post Anneal: 1.76
% Film Shrinkage: 3.06

Example 2

Argon Gas HDP Anneal

Time: 700 s
LF Power: 5750 W
Gas flow rate: 250 sccm
Avg. Temperature: 469° C.
Stress, Post Anneal: 2.53 dyn/cm$^2$
k, Post Anneal: 3.86
WERR, Post Anneal: 2.77
% Film Shrinkage: 12.15

Figure 5A:
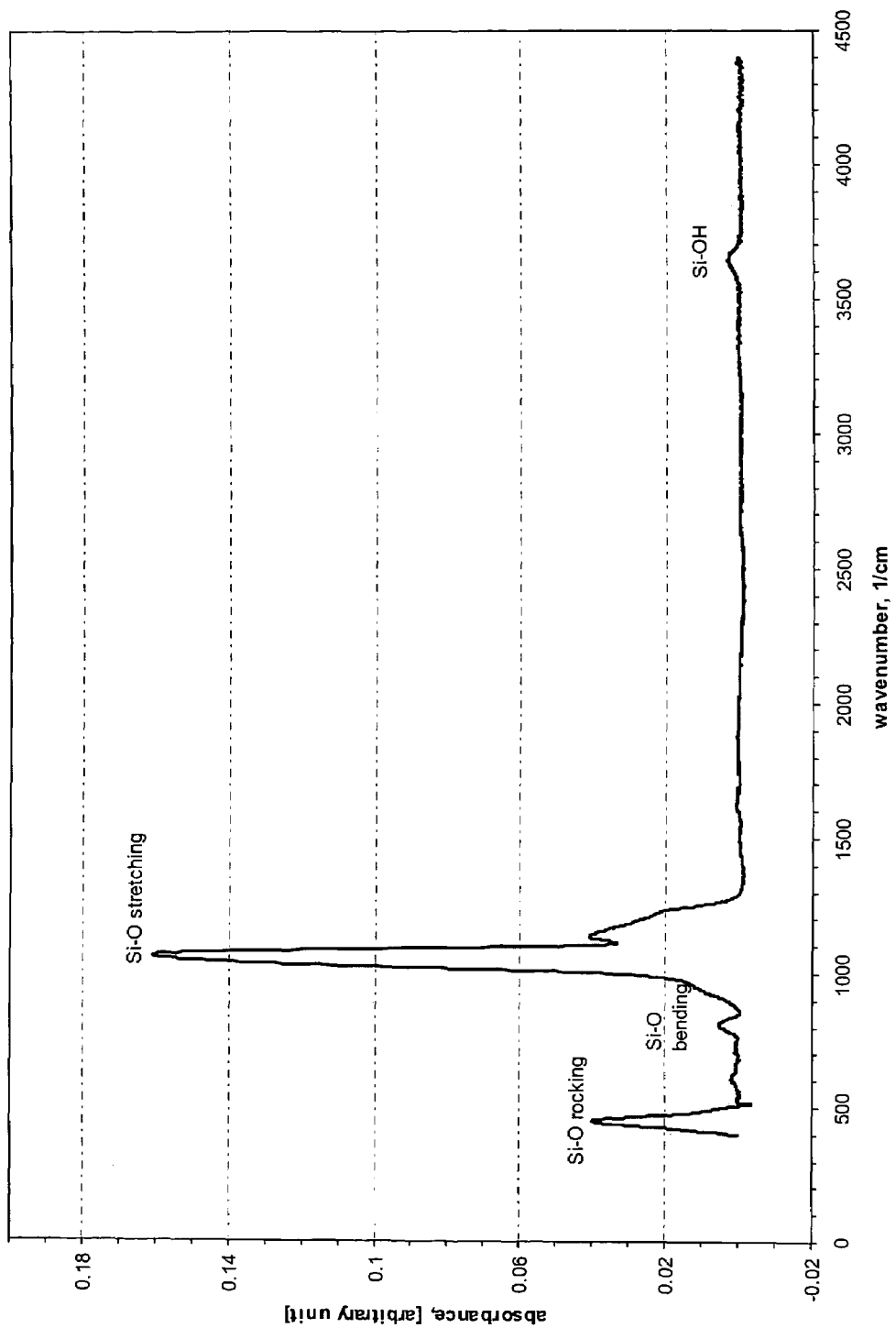
FIGS. 5A and B are FTIR plots that illustrate the removal of water by the HDP annealing process according to one embodiment of the invention.
Figure 5B:
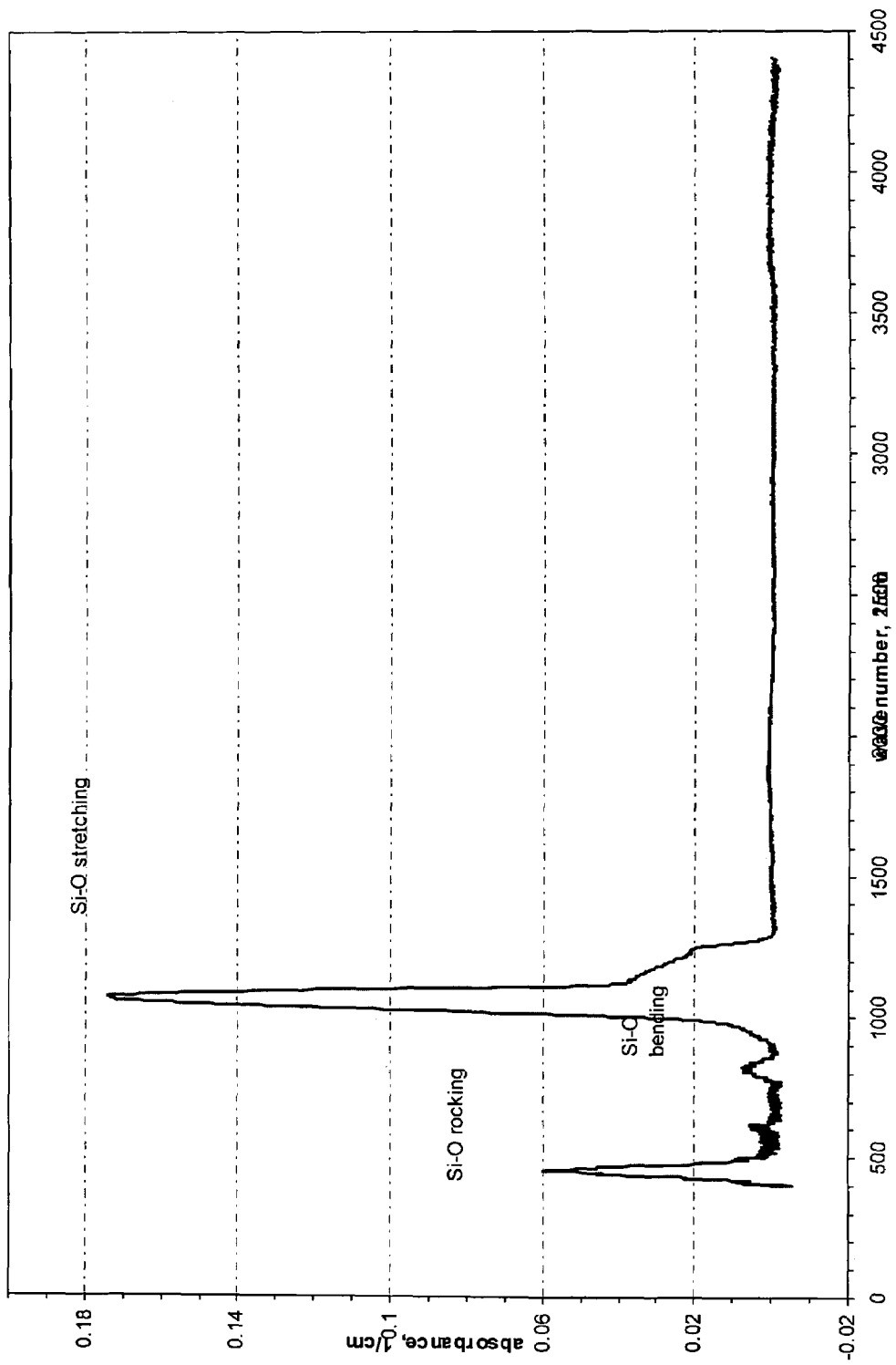

While not wishing to be limited by theory, it is believed that these differences are due to cross-linking in the densified PDL film. Note also that film stress variation measured before and after the anneal is consistent with the shrinkage measurements, i.e., in the case of the Argon anneal, there is more film shrinkage and more tensile stress after the anneal than in the O$_2$ anneal. However, in both cases, reduced dielectric constant values indicate that H$_2$O has been removed from the film. This is substantiated further by the FTIR spectra shown in FIGS. 5A and B, which show an increase in the size of the Si—O peak post-anneal (at 1058-1062 cm$^{-1}$) and in the disappearance of the Si—OH peak at 3641 cm$^{-1}$.

Figure 6:
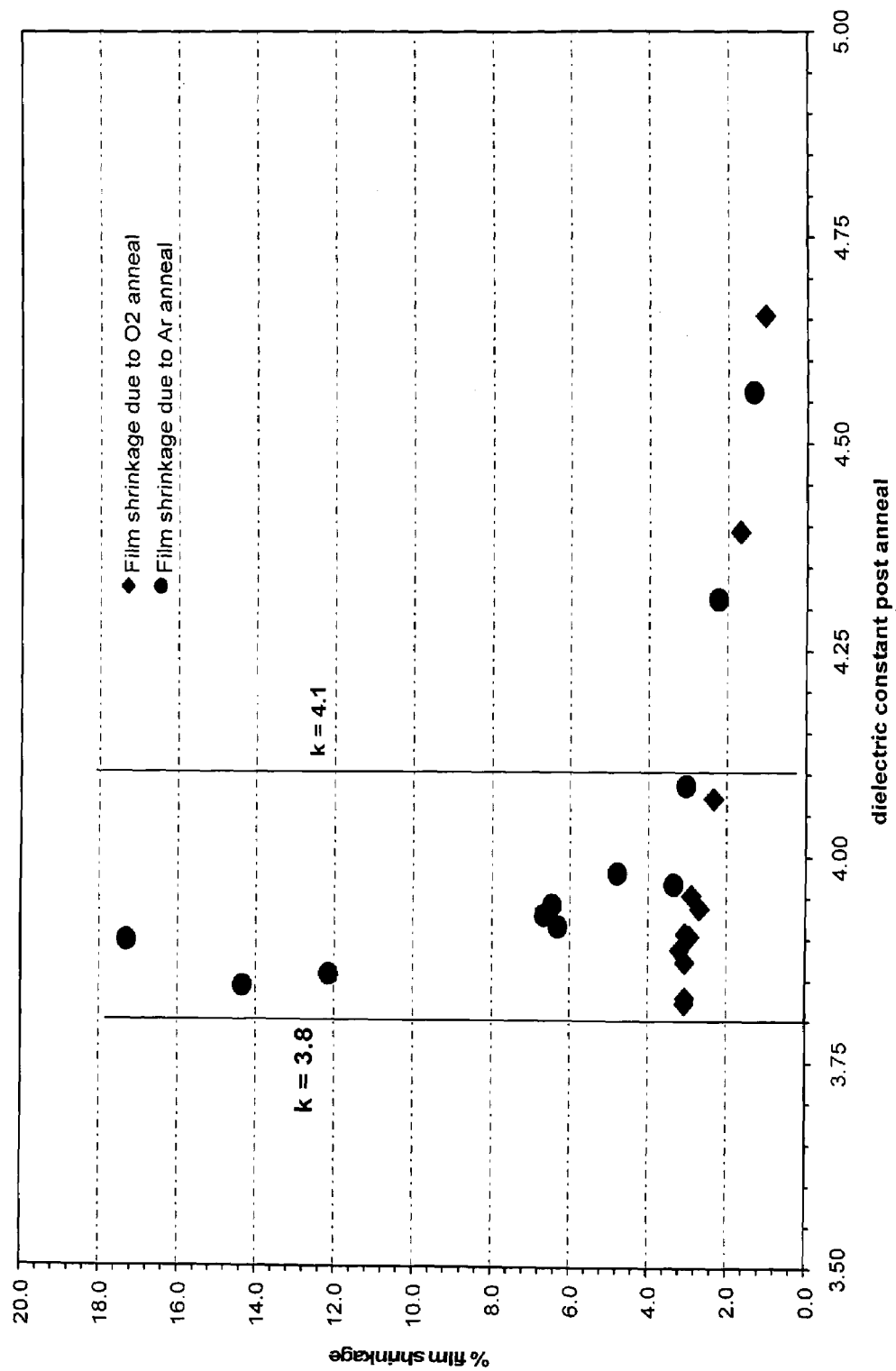
FIG. 6 is a plot of % film shrinkage vs. dielectric constant that illustrates a benefit of using an oxygen-containing reactant in the HDP plasma, when compared to using Argon annealing process according to one embodiment of the invention.

FIG. 6 is a plot of % film shrinkage vs. dielectric constant that illustrates a benefit of using an oxygen-containing reactant in plasma, when compared to using an Argon-containing plasma. Results show that the dielectric constant (k) of the O$_2$ and Ar plasma annealed films is about the same, and lower than 4, after anneal at temperatures as low as 400° C. The k value indicates that H$_2$O has been removed from the film, and the FTIR spectra confirm this conclusion. Comparing the results of O$_2$ anneal to those of Ar anneal plotted in FIG. 6, it can be seen that the reduction in k value for the case of O$_2$ corresponds to much lower film shrinkage (on the order of 3% vs.>almost 5% and even greater than 10% in some cases). This is likely due to the fact that the use of oxidizing chemistry in a high density plasma results in the generation of reactive oxygen species (O$_2$+, O+), which diffuse into the film, react to form Si—O bonds and result in the material expanding. This also implies that that the material in the trenches will expand and the formation of seams as a result of film anneal will be minimized or eliminated.

Figure 7:
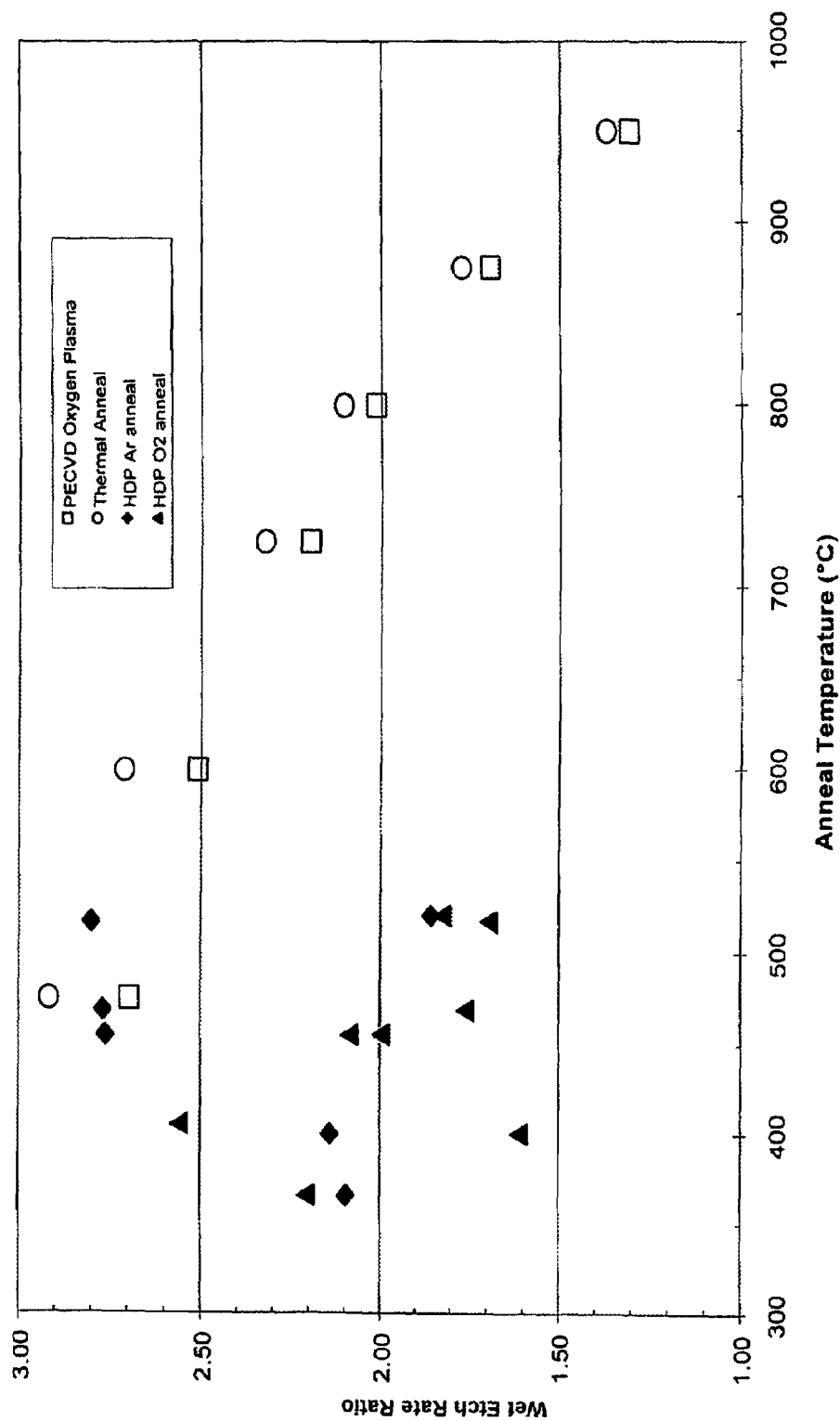
FIG. 7 is a plot of improved WERR for films that have been subjected to HDP $O_2$ annealing process according to one embodiment of the invention.

Preliminary results on structure wafers show that film quality equivalent to that of thermally annealed films (at 800° C.) can be achieved with an HDP based anneal step in the presence of O$_2$. The temperature of operation is less than 500° C. The conclusion is based on the quality of the film deposited in high (>6:1) aspect ratio structures. After anneal and decoration with polysilicon etch solution for 10 sec, there was no observable voiding in the film. The performance is similar to the that of thermally annealed PDL films with the additional advantage that it is achieved at significantly lower temperature. This can be readily concluded from the results shown in Table 3, where the properties of thermally vs. HDP annealed films are summarized and compared. FIG. 7 illustrates improved WERR for films subjected to HDP O$_2$ anneal, and corresponds to the data shown in table 3.

TABLE 3

Effect of reactive (in O$_2$ gas) HDP anneal on film properties.

| Anneal Method | Time sec | Ave Temp. ° C. | k, post anneal | WERR. Post anneal | % film shrinkage |
| --- | --- | --- | --- | --- | --- |
| HDP | 600 | <500 | 4.00 | 1.60 | 3.00 |
| Thermal | 1800 | >800 | 4.00 | 2.00 | >7 |

It can be seen that optimization of RVD film properties can be achieved at a temperature under 500° C. through the use of a post-deposition HDP anneal. This means that RVD films can be used for PMD applications, in which thermal budget constraints do not allow for high temperature anneal. Given that oxygen species need to diffuse into the film to densify/cross-link it, process conditions that facilitate diffusion (e.g., high O$_2$ partial pressure, such as >100 mTorr may improve the performance of the method.)

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to the use of an aluminum-containing precursor in the RVD process, other catalytic metal precursors, as noted herein, can also be used. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of forming a dielectric film, the method comprising:
   (a) exposing a substrate surface to a metal catalyst-containing precursor gas to form a substantially saturated layer of metal catalyst-containing precursor on the substrate surface;
   (b) exposing the substrate surface to a silicon-containing precursor gas to form the dielectric film; and
   (c) annealing the dielectric film in a low temperature oxygen-containing inductively coupled high density plasma.

2. The method of claim 1, wherein the metal catalyst-containing precursor is an aluminum-containing precursor.

3. The method of claim 1, wherein the metal catalyst-containing precursor is selected from the list of metal catalyst-containing precursors comprising Zirconium, Hafnium, Gallium, Titanium, Niobium, and Tantalum.

4. The method of claim 1, wherein the annealing is conducted at a temperature under 500° C.

5. The method of claim 4, wherein the annealing is conducted at a temperature between about 400 and 500° C.

6. The method of claim 5, wherein the annealing is conducted at a temperature of about 400° C.

7. The method of claim 1, wherein the oxygen in the plasma is provided by an oxygen-containing precursor gas.

8. The method of claim 7, wherein the oxygen-containing precursor gas comprises one selected from the group consisting of $H_2O$, air, $O_2$, $O_3$ and $H_2O_2$ and combinations thereof.

9. The method of claim 1, wherein a oxygen-containing precursor gas comprises air.

10. The method of claim 1, wherein oxygen-containing precursor gas comprises $O_2$.

11. The method of claim 1, wherein the substrate is a partially fabricated semiconductor wafer.

12. The method in claim 1, wherein the dielectric film is deposited over gaps in the partially fabricated semiconductor wafer.

13. The method of claim 2, wherein the aluminum-containing precursor is at least one of hexakis(dimethylamino) aluminum and trimethyl aluminum.

14. The method of claim 1, wherein the silicon-containing precursor is at least one of a silanol and a silanediol.

15. The method of claim 1, wherein the silicon-containing precursor is at least one of tris(tert-butoxy)silanol $((C_4H_9O)_3SiOH)$ and tris(tert-pentoxy)silanol $((C_5H_{11}O)_3SiOH)$.

16. The method of claim 1, wherein a flow rate of metal catalyst-containing precursor range between about 100 and 400 sccm.

17. The method of claim 1, wherein the flow rate of silicon-containing precursor gas range between about 200 and 1000 sccm.

18. The method of claim 1, further comprising purging with an inert gas exposures of precursor gas.

19. The method of claim 1, wherein the annealing is conducted for a time period of between about 330 to 700 sec.

20. The method of claim 1, wherein the annealing is conducted for a time period of about 600 sec.

21. The method of claim 10, wherein the $O_2$ has a partial pressure of greater than 100 mTorr.

22. The method of claim 1, wherein the annealing is conducted in a high-density plasma chemical vapor deposition reactor comprising an electrode that generates a plasma from the process gas.

23. The method of claim 1, wherein a radio frequency bias is applied to the substrate.

24. The method of claim 23, wherein applying the bias to the substrate comprises supporting the substrate on a substrate holder having an electrode supplying the radio frequency bias to the substrate, the radio frequency bias being generated by supplying the electrode with at least 0.1 W/cm$^2$ of power.

25. The method of claim 3, wherein the radio frequency bias applied to the substrate is at the frequency range of between about 100 kHz and 27 MHz.

26. The method of claim 1, wherein the annealing is conducted in a high-density plasma chemical vapor deposition reactor maintained at a pressure of between about 1 and 1000 mTorr during annealing.

27. The method of claim 26, wherein the high-density plasma chemical vapor deposition reactor is maintained at a pressure of about 2 mTorr during annealing.

28. The method of claim 1, wherein the substrate is placed on placed on a substrate holder that is maintained at a temperature of about 300 and 500° C.

29. A method of forming a dielectric film, the method comprising:
   (a) exposing a substrate surface to a metal catalyst-containing precursor gas to form a substantially saturated layer of metal catalyst-containing precursor on the substrate surface;
   (b) exposing the substrate surface to a silicon-containing precursor gas to form the dielectric film; and
   (c) in a low temperature oxygen-containing inductively coupled high density plasma such that the film undergoes a film shrinkage of less than 4% resulting in a dielectric film has a k-value of 4.1 or less.

30. The method of claim 29, wherein the resulting dielectric film has a post-anneal film stress of less than 2 Gdyn/cm$^2$ tensile.

31. The method of claim 29, wherein the resulting dielectric film has a post-anneal wet etch rate ratio (WERR) of less than 2:1.

32. A method of forming a dielectric film, the method comprising:

(a) exposing a substrate surface to an aluminum-containing precursor gas to form a substantially saturated layer of aluminum-containing precursor on the substrate surface;

(b) exposing the substrate surface to a silicon-containing precursor gas to form the dielectric film; and (c) annealing the dielectric film in a low temperature oxygen-containing inductively coupled high density plasma.

* * * * *

UNITED STATES PATENT AND TRADEMARK OFFICE
CERTIFICATE OF CORRECTION

| | | |
|---|---|---|
| PATENT NO. | : 7,297,608 B1 | Page 1 of 1 |
| APPLICATION NO. | : 10/874696 | |
| DATED | : November 20, 2007 | |
| INVENTOR(S) | : Papasouliotis et al. | |

It is certified that error appears in the above-identified patent and that said Letters Patent is hereby corrected as shown below:

In the Claims:

In line 9 of claim 29 (column 12, line 56) insert --annealing the dielectric film-- before "in a low".

Signed and Sealed this

Ninth Day of September, 2008

JON W. DUDAS
*Director of the United States Patent and Trademark Office*